(12) United States Patent
Wang

(10) Patent No.: US 9,793,508 B2
(45) Date of Patent: Oct. 17, 2017

(54) OLED DISPLAY PANEL AND OLED DISPLAY DEVICE APPLYING IT

(71) Applicant: BOE TECHNOLOGY GROUP CO., LTD., Beijing (CN)

(72) Inventor: Huifeng Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/435,970

(22) PCT Filed: Oct. 1, 2014

(86) PCT No.: PCT/CN2014/088076
§ 371 (c)(1),
(2) Date: Apr. 15, 2015

(87) PCT Pub. No.: WO2015/169047
PCT Pub. Date: Nov. 12, 2015

(65) Prior Publication Data
US 2016/0181566 A1  Jun. 23, 2016

(30) Foreign Application Priority Data
May 9, 2014 (CN) .......................... 2014 1 0194343

(51) Int. Cl.
*H01L 51/52* (2006.01)
*H01L 27/32* (2006.01)

(52) U.S. Cl.
CPC ........ *H01L 51/525* (2013.01); *H01L 27/3246* (2013.01); *H01L 51/5228* (2013.01);
(Continued)

(58) Field of Classification Search
CPC ..................................................... H01L 51/525
See application file for complete search history.

(56) References Cited

U.S. PATENT DOCUMENTS

2007/0013293 A1  1/2007  Cok
2008/0143255 A1  6/2008  Lee et al.
(Continued)

FOREIGN PATENT DOCUMENTS

| CN | 103325812 A | 9/2013 |
|---|---|---|
| CN | 103545345 A | 1/2014 |

(Continued)

OTHER PUBLICATIONS

International Search Report of PCT/CN2014/088076 in Chinese with English translation, dated Feb. 9, 2015.
(Continued)

*Primary Examiner* — Benjamin Sandvik
(74) *Attorney, Agent, or Firm* — Collard & Roe, P.C.

(57) ABSTRACT

Disclosed are an OLED display panel and an OLED display device. The OLED display panel includes an array substrate (21) which is covered by a cathode (211) and a color filter substrate (22) on which an auxiliary electrode (221) is formed. A contact structure is disposed between the color filter substrate (22) and the array substrate (21) to electrically connect the cathode (211) and the auxiliary electrode (221), and the contacting area between the contact structure and the array substrate (21) is greater than or equal to that between auxiliary electrode (221) and the contact structure. The OLED display panel avoids broken circuit between the auxiliary electrode and the cathode that tends to occur due to excessive pressure upon cell-assembling a top-emitting OLED display panel.

13 Claims, 3 Drawing Sheets

(52) U.S. Cl.
CPC ........ *H01L 27/322* (2013.01); *H01L 51/5243* (2013.01); *H01L 51/5246* (2013.01); *H01L 2251/5315* (2013.01)

(56) References Cited

U.S. PATENT DOCUMENTS

| | | | |
|---|---|---|---|
| 2010/0097295 A1* | 4/2010 | Kwak | H01L 27/322 345/32 |
| 2013/0069085 A1* | 3/2013 | Kang | H01L 51/56 257/88 |
| 2014/0077171 A1 | 3/2014 | Yamakita et al. | |
| 2015/0162387 A1* | 6/2015 | Gu | G06F 3/0412 345/174 |
| 2016/0035980 A1 | 2/2016 | Kong et al. | |

FOREIGN PATENT DOCUMENTS

| | | |
|---|---|---|
| CN | 103715231 A | 4/2014 |
| CN | 103972270 A | 8/2014 |
| CN | 203812883 U | 9/2014 |
| JP | 2009-295447 A | 12/2009 |

OTHER PUBLICATIONS

Notice of Transmittal of the International Search Report of PCT/CN2014/088076 in Chinese, dated Feb. 9, 2015.
Written Opinion of the International Searching Authority of PCT/CN2014/088076 in Chinese with English translation dated Feb. 9, 2015.
First Chinese Office Action in Chinese Application No. 201410194343.6 dated Feb. 28, 2015 with English translation.
Second Chinese Office Action in Chinese Application No. 201410194343.6 dated Jun. 3, 2015 with English translation.
Notification to Grant the Patent Right (Notice of Allowance) in Chinese Application No. 201410194343.6 dated Jan. 29, 2016 with English translation.
Issued Patent for Chinese Application No. 201410194343.6 (CN 103972270 B) dated Mar. 2, 2016 in Chinese with the Chinese granted claims with an English translation.

* cited by examiner

OLED DISPLAY PANEL AND OLED DISPLAY DEVICE APPLYING IT

CROSS REFERENCE TO RELATED APPLICATIONS

This application is the National Stage of PCT/CN2014/088076 filed on Oct. 1, 2014, which claims priority under 35 U.S.C. §119 of Chinese Application No. 201410194343.6 filed on May 9, 2014, the disclosure of which is incorporated by reference.

FIELD OF THE INVENTION

Embodiments of the present invention relate to an OLED display panel and an OLED display device applying it.

BACKGROUND

In flat display panels, organic light emitting diode (OLED) display panels have received people's attention widely due to their advantages such as self luminescence, fast response, wide viewing angle, high luminance, fresh colors and being light and thin.

The structure of an OLED usually includes an anode layer, a cathode layer and a luminescent layer disposed between the anode layer and the cathode layer. The luminescence principle of an OLED is as follows. When a voltage is applied between the anode layer and the cathode layer, under the driving of the external voltage, holes injected from the anode layer overcome the interfacial barrier and are transported into the luminescent layer, and electrons injected from the cathode layer overcome the interfacial barrier and are transported into the luminescent layer. Holes and electrons arriving in the luminescent layer recombine to form excitons that experience radiative transitions to bring about luminescence, namely electroluminescence. According to different light emitting surfaces, OLED display panels may be classified into top emitting and bottom emitting types. An OLED display panel includes a pixel array.

In order to increase light transmittance, thin transparent conducting materials are required for the cathode. However, a thin transparent cathode has a high sheet resistance, and a large voltage drop would occur when a current flows through the cathode. Therefore, the farther a pixel is from the power supply point, the smaller cathode voltage it obtains, which leads to a lower display luminance of the pixel than a pixel closer to the power supply point, thereby deteriorating the luminance uniformity of the OLED display device.

SUMMARY

At least one embodiment of the present invention provides an OLED display panel and an OLED display device applying it to avoid broken circuit between the auxiliary electrode and the cathode that tends to occur due to excessive pressure upon cell-assembling a top emitting OLED display panel.

At least one embodiment of the present invention provides an OLED display panel comprising: an array substrate which is covered by a cathode; a color filter substrate on which an auxiliary electrode is formed; and a contact structure provided between the color filter substrate and the array substrate. The contact structure is configured to electrically connect the cathode and the auxiliary electrode, and the contacting area between the contact structure and the array substrate is greater than or equal to that between the auxiliary electrode and the contact structure.

For example, in one embodiment, the contact structure comprises a spacer and a transparent conductive film on the color filter substrate, the spacer is formed on the auxiliary electrode, the transparent conductive film covers a surface of the color filter substrate and covers at least a surface of the spacer and the auxiliary electrode not blocked by the spacer; a pixel defining layer of the array substrate has a depressed section at a location corresponding to the spacer; the cathode further covers the surface in the depressed section; the spacer on the color filter substrate, whose surface is covered with the transparent conductive film, is inserted into the depressed section of the array substrate whose surface is covered with the cathode.

For example, in one embodiment, a surface shape of the depressed section after being covered by the cathode on the surface matches a surface shape of the spacer contained in the depressed section after being covered by the transparent conductive film on its surface.

For example, conducting glue is placed between the spacer, the surface of which is covered by the transparent conductive film, contained in the depressed section and the cathode in the depressed section.

For example, in one embodiment, the contact structure comprises a spacer formed on a planarization layer of the color filter substrate, and the auxiliary electrode is on top of the spacer; a pixel defining layer of the array substrate has a depressed section at a location corresponding to the spacer; the cathode further covers the surface in the depressed section; the spacer on the color filter substrate with the auxiliary electrode formed on its top is inserted into the depressed section of the array substrate whose surface is covered with the cathode.

For example, a surface shape of the depressed section of the array substrate after being covered by the cathode on the surface matches a surface shape of the spacer contained in the depressed section which is formed on the color filter substrate with the auxiliary electrode on its top.

For example, conducting glue is placed between the spacer, which has the auxiliary electrode on its top, contained in the depressed section and the cathode in the depressed section.

For example, in one embodiment, transparent conducting glue is placed in a gap between the array substrate and the color filter substrate, and the transparent conducting glue is placed at least between the auxiliary electrode and the cathode to form the contact structure.

At least one embodiment of the present invention provides an OLED display device including the above-mentioned OLED display panel.

BRIEF DESCRIPTION OF DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiments, without any inventive work, which should be within the scope of the invention.

Figure 1:
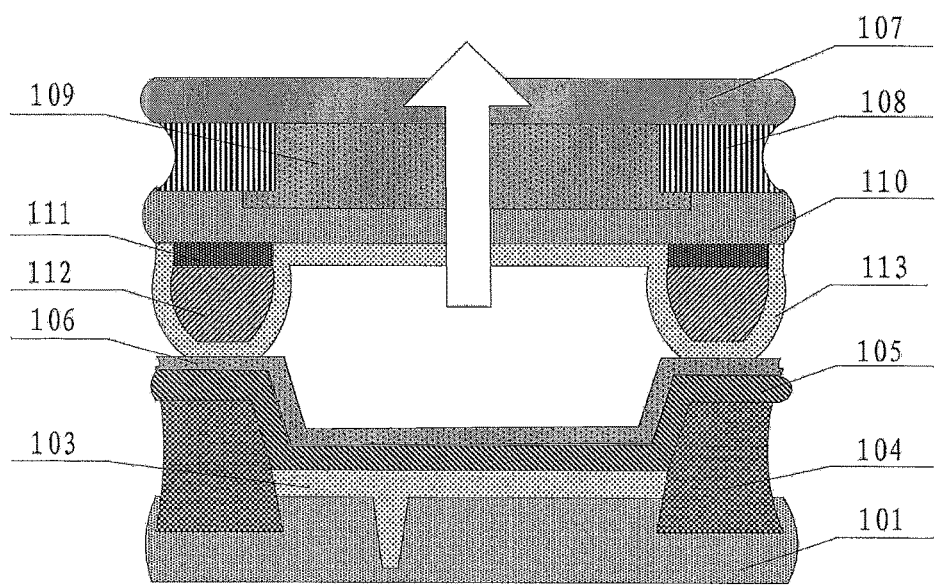
FIG. 1 is a structure diagram of an OLED display panel.

FIG. 1 shows a structure of a pixel in a top emitting OLED display panel, which includes an array substrate and a color filter substrate. The array substrate includes a thin film transistor device layer (not shown in FIG. 1), an anode 103, a pixel defining layer 104, a luminescent layer 105 and a cathode 106 formed on a first substrate 101; and the color filter substrate includes a black matrix 108, a color filter 109 and a planarization layer 110 formed on a second substrate 107. The pixel defining layer 104 corresponds to the black matrix 108 in their locations. In operation of the OLED display panel, light is emitted from the luminescent layer 105 by applying a voltage between the anode 103 and the cathode 106, and light (as shown in FIG. 1 by the hollow arrowhead) transmits through the transparent cathode 106 and the color filter substrate on the top, realizing top emission.

The OLED display panel includes a pixel array consisting of a plurality of pixels shown in FIG. 1. Anodes 103 of the pixels are separated by the pixel defining layer 104 for mutual electrical insulation, and the anode of each pixel obtains electrical signals from the thin film transistor connected therewith. The luminescent layer 105 and the cathode 106 cover the entire pixel array, and the cathodes are supplied with power by a power supply on a side of the pixel array.

In order to solve deteriotation of the luminance uniformity, it is possible to provide an auxiliary electrode 111 with small resistance on the planarization layer of the color filter substrate to reduce the resistance of the cathode 106, as shown in FIG. 1. A spacer 112 is formed on the auxiliary electrode 111 to prevent the substrate surface from damage caused by hard contact between the substrates while cell-assembling the color filter substrate and the array substrate. A transparent conductive layer 113 is further placed on the surface of the color filter substrate to realize electrical connection between the auxiliary electrode 111 and the cathode 106 after cell-assembling the color filter substrate and the array substrate.

The inventors found out that when the OLED display panel shown in FIG. 1 is manufactured, the spacer 112 formed on the auxiliary electrode 111 has an elongated conical structure with a small area at the top, and while cell-assembling the color filter substrate and the array substrate, the transparency conductive layer covering the top of the spacer contacts the array substrate. Due to a small area of the top of the spacer, the contacting area is significantly smaller than the surface area of the auxiliary electrode that faces the array substrate, and a large force is exerted on the spacer 112, which makes the top of the spacer 112 experience a large pressure, and the transparent conductive layer 113 on the top of the spacer 112 is subjected to a large pressure and tends to break, thereby causing broken circuit between the cathode and the auxiliary electrode.

Figure 2:
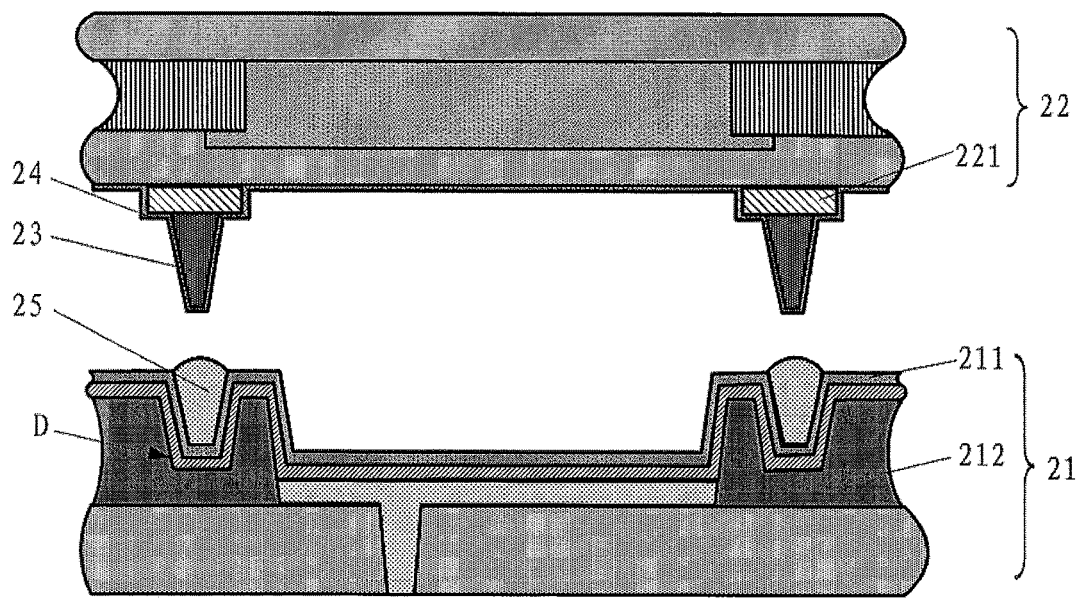
FIG. 2 is a structure diagram of an OLED display panel provided in an embodiment of the present invention.

At least one embodiment of the present invention provides an OLED display panel. As shown in FIG. 2, the OLED display panel includes an array substrate 21 which is covered by a cathode 211 and a color filter substrate 22 on which an auxiliary electrode 221 is formed. The OLED display panel further includes a contact structure disposed between the color filter substrate 22 and the array substrate 21 to electrically connect the cathode 211 and the auxiliary electrode 221, and the contacting area between the contact structure and the array substrate 21 is greater than that between auxiliary electrodes 221 and the contact structure.

In the OLED display panel provided in at least one embodiment of the present invention, the contact structure can electrically connect the auxiliary electrode and the cathode, and the contacting area between the contact structure and the array substrate is larger than that between the auxiliary electrode and the contact structure, thereby increasing the contacting area between the contact structure and the cathode covering the array substrate. Even if the contact structure is subjected to a large force, the contacting region thereof experiences a small pressure, which may significantly reduce the risk of broken circuit between the auxiliary electrode and the cathode due to large pressure upon cell-assembling.

In the OLED display panel provided in the above-mentioned embodiment, as shown in FIG. 2, the contact structure may include a spacer 23 and a transparent conductive film 24 formed on the color filter substrate 22, in which the spacer 23 is formed on the auxiliary electrode 221, and the transparent conductive film 24 covers a surface of the color filter substrate 22 and covers at least a surface of the spacer 23 and the auxiliary electrode 221 not blocked by the spacer 23. The pixel defining layer 212 of the array substrate 21 has a depressed section D at a location corresponding to the spacer 23; and the cathode 211 further covers the surface inside the depressed section D. After disposing the array substrate and the color filter substrate oppositely, the spacer 23 covered by the transparent conductive film 24 on the surface is inserted into the depressed section D covered with the cathode 211 on its surface.

It is to be noted that, in order to make the contact structure more clear, FIG. 2 shows the structures of the array substrate 21, the color filter substrate 22 and the contact structure before cell-assembling. Therefore, in FIG. 2, the spacer 23 covered by the transparent conductive film 24 on the surface has not been inserted into the depressed section D covered by the cathode 211 on its surface yet. Whereas the structure of the OLED display panel described in the present embodiment is the structure after cell-assembling, as shown in FIG. 3.

The contacting region between the transparent conductive film 24 inside the depressed section D and the cathode 211 is the contacting region between the above-mentioned contact structure and the array substrate. Since the contacting region includes not only the surface of the transparent conductive layer 24 covering the top of the spacer 23, but also includes the surface of the transparent conductive layer 24 covering partial side walls of the spacer 23, the area of the contacting region increases significantly to be greater than the area of the contacting region between the auxiliary electrode 221 and the spacer 23 (namely contacting region between the auxiliary electrode and the contact structure). While the spacer 23 is exerted with a force, the pressure exerted on the transparent conductive layer 24 would decrease significantly, thereby reducing the risk of broken circuit between the auxiliary electrode 221 and the cathode 211 caused by break of the transparent conductive layer 24.

Figure 3:
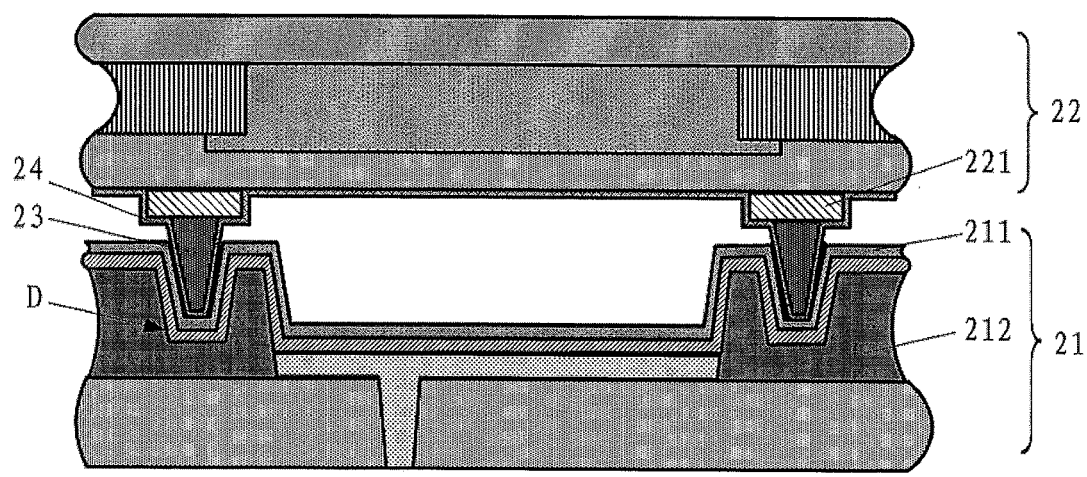
FIG. 3 is a structure diagram of the OLED display panel shown in FIG. 2 after cell-assembling.

In the OLED display panel shown in FIG. 3, a surface shape of the depressed section D after being covered by the cathode 211 on the surface matches for example a surface shape of the spacer 23 contained therein after being covered by the transparent conductive film 24. This allows the transparent conductive film 24 and the cathode to contact closely without any gap, thereby avoiding increased contacting resistance.

In addition, in the OLED display panel shown in FIG. 2, conducting glue 25 may be placed between the spacer 23 contained in depressed section D after being covered by the transparent conductive film 24 on the surface and the cathode 211 in the depressed section D. Therefore, when any gap exists between the transparent conductive film 24 and the cathode 211 such that they can not contact closely, conducting glue 25 is placed in the gap to prevent contacting resistance from increasing.

Figure 4:
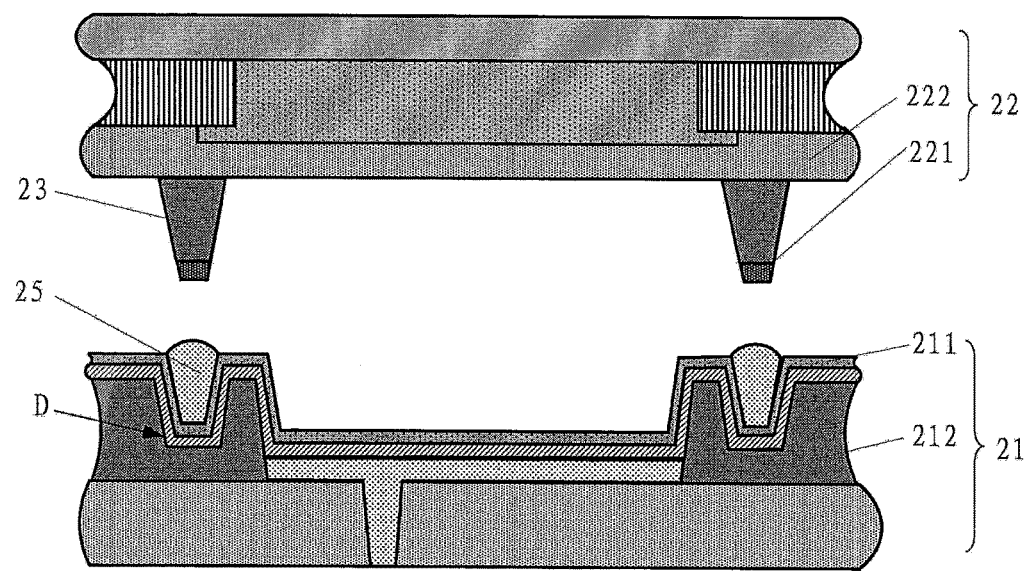
FIG. 4 is a structure diagram of an OLED display panel provided in another embodiment of the present invention.

In another embodiment of the present invention, as shown in FIG. 4, the contact structure may include a spacer 23 formed on the planarization layer 222 of the color filter substrate 22 with an auxiliary electrode 221 on top of the spacer 23; and the pixel defining layer 212 of the array substrate 21 has a depressed section D at a location corresponding to the spacer 23, and the cathode 211 further covers the surface inside the depressed section D. After disposing the array substrate and the color filter substrate oppositely, the spacer 23 with the auxiliary electrode 221 formed on its top is inserted into the depressed section D covered with the cathode 211 on the surface.

It is to be noted that, in order to make the contact structure more clear, FIG. 4 shows a specific structure of the array substrate 21, the color filter substrate 22 and the contact structure before cell-assembling. Therefore, in FIG. 4, the spacer 23 formed with the auxiliary electrode 221 on its top has not been inserted into the depressed section D covered by the cathode 211 on the surface yet. The structure of the OLED display panel described in the present embodiment is the structure after cell-assembling, as shown in FIG. 5.

The contacting region between the spacer 23 inside the depressed section D and the cathode 211 is the contacting region between the above-mentioned contact structure and the array substrate. Since the contacting region includes partial side wall surfaces of the spacer 23, the area of contacting region is increased significantly to be greater than the area of contacting region between the auxiliary electrode 221 and the spacer 23 (namely contacting region between the auxiliary electrode and the contact structure).

Figure 5:
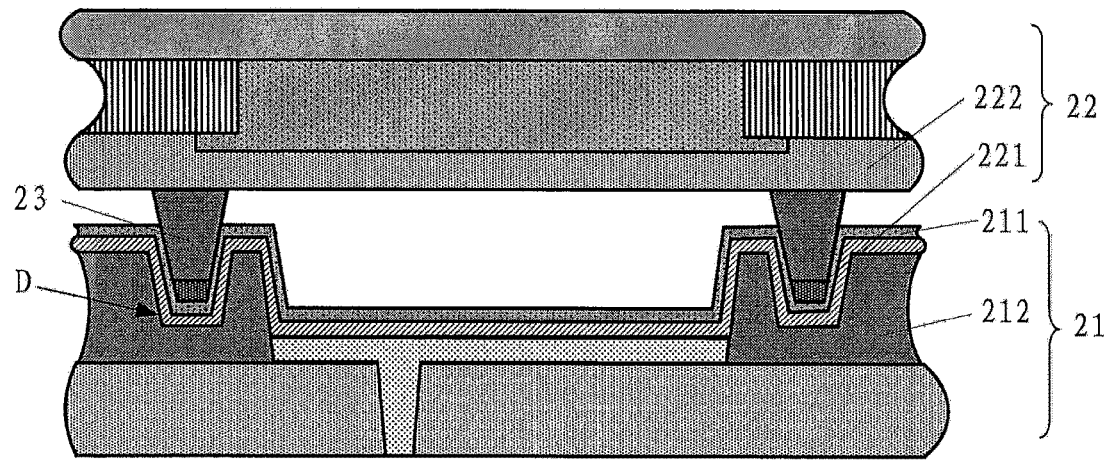
FIG. 5 is a structure diagram of the OLED display panel shown in FIG. 4 after cell-assembling.

In the implementations shown in FIGS. 4 and 5, since the auxiliary electrode 221 on top of the spacer 23 can electrically contact the cathode inside the depressed section D directly, it is unnecessary to provide the transparent conductive layer between the spacer 23 inside the depressed section D and the cathode 211, which eliminates the problem of breaking of transparent conductive layer while the spacer 23 is exerted with a force, thereby avoiding broken circuit problem between the auxiliary electrode 221 and the cathode 211 caused by excessive pressure upon cell-assembling.

In the OLED display panel shown in FIG. 5, a surface shape of the depressed section D after being covered by the cathode 211 on the surface matches, for example, a surface shape of the spacer 23 contained therein which is formed with auxiliary electrodes 221 on its top. This allows the auxiliary electrode 221 and the spacer 23 contact the cathode 211 closely without any gap, thereby preventing the contacting resistance between the auxiliary electrode 221 and the cathode 211 from increasing.

In addition, in the OLED display panel shown in FIG. 4, conducting glue 25 may be placed between the spacer 23 with the auxiliary electrode 221 on its top which is contained in the depressed section D and the cathode 211 inside depressed sections D. Therefore, when any gap exists between the auxiliary electrode 221 and the cathode 211 such that they can not contact closely, conducting glue 25 is placed in the gap to prevent contacting resistance from increasing.

Figure 6:
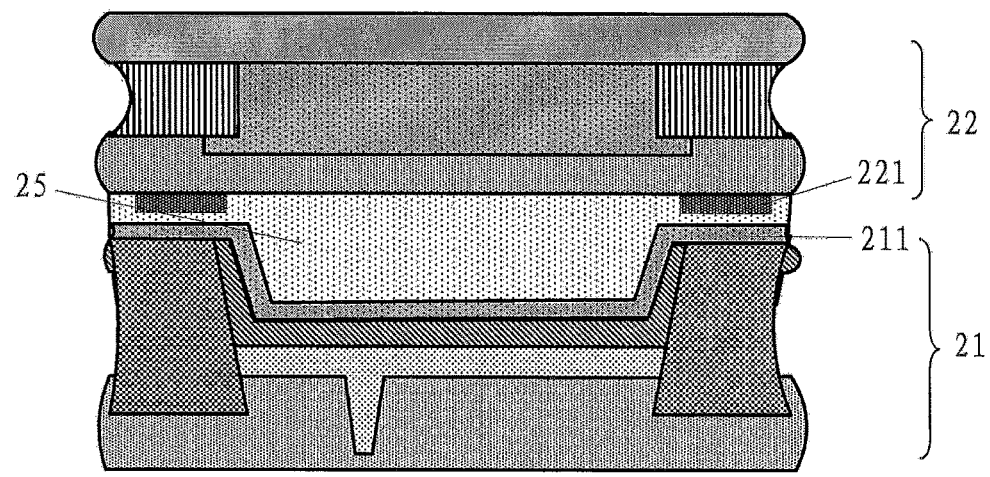
FIG. 6 is a structure diagram of an OLED display panel provided in yet another embodiment of the present invention.

In yet another embodiment of the present invention, as shown in FIG. 6, transparent conducting glue 25 is placed in the gap between the array substrate 21 and the color filter substrate 22, which is placed at least between the auxiliary electrode 221 and the cathode 211 to form a contact structure.

When the transparent conducting glue 25 is only placed between the auxiliary electrode 221 and the cathode 211, the area of contacting region between the contact structure formed of the transparent conducting glue 25 and the array substrate 21 equals the area of contacting region between the contact structure formed of the transparent conducting glue 25 and the auxiliary electrode 221. When the transparent conducting glue 25 is placed in the entire gap between the array substrate 21 and the color filter substrate 22, the area of contacting region between the contact structure formed of the transparent conducting glue 25 and the array substrate 21 is greater than the area of contacting region between the contact structure formed of the transparent conducting glue 25 and the auxiliary electrode 221.

In the implementation shown in FIG. 6, since the auxiliary electrode 221 on the color filter substrate 22 may electrically contact the cathode 211 via the transparent conducting glue 25, it is not necessary to provide the transparent conductive layer between the auxiliary electrode 221 and the cathode 211. And since the transparent conducting glue 25 has strong deformability, even if the transparent conducting glue 25 experiences a large pressure while cell-assembling, it would not be broken, thereby avoiding broken circuit problem between the auxiliary electrode 221 and the cathode 211 caused by excessive pressure upon cell-assembling.

At least one embodiment of the present invention further provides an OLED display device including the OLED display panel described in any one embodiment of the present invention. Since the probability of broken circuit between the auxiliary electrode and the cathode in the OLED display panel decreases significantly, the OLED display device may have significantly enhanced display performance.

What are described above is related to the illustrative embodiments of the disclosure only and not limitative to the scope of the disclosure; the scopes of the disclosure are defined by the accompanying claims.

The present application claims priority of a Chinese patent application No. 201410194343.6 filed on May 9, 2014, which is incorporated in its entirety herein by reference as part of the present application.

What is claimed is:
1. An OLED display panel, comprising:
an array substrate which is covered by a cathode,
a color filter substrate on which an auxiliary electrode is formed,
a contact structure provided between the color filter substrate and the array substrate, wherein the contact structure is configured to electrically connect the cathode and the auxiliary electrode, and the contacting area between the contact structure and the array substrate is greater than or equal to that between the auxiliary electrode and the contact structure, and the contact structure is in contact with the auxiliary electrode and does not include the cathode, wherein the contact structure comprises a spacer and a transparent conductive film on the color filter substrate; the spacer is formed on the auxiliary electrode; and the transparent conductive film covers a surface of the color filter substrate and covers at least a surface of the spacer and the auxiliary electrode not blocked by the spacer;

a pixel defining layer of the array substrate has a depressed section at a location corresponding to the spacer;

the cathode further covers the surface inside the depressed section; and the spacer on the color filter substrate, whose surface is covered with the transparent conductive film, is inserted into the depressed section of the array substrate whose surface is covered with the cathode.

2. The OLED display panel of claim 1, wherein a surface shape of the depressed section of the array substrate after being covered by the cathode on the surface matches a surface shape of the spacer on the color filter substrate contained in the depressed section after being covered by the transparent conductive film on its surface.

3. The OLED display panel of claim 1, wherein conducting glue is placed between the spacer, whose surface is covered by the transparent conductive film, contained in the depressed section and the cathode in the depressed section.

4. The OLED display panel of claim 2, wherein conducting glue is placed between the spacer, whose surface is covered by the transparent conductive film, contained in the depressed section and the cathode in the depressed section.

5. An OLED display device comprising an OLED display panel of claim 1.

6. An OLED display device comprising an OLED display panel of claim 2.

7. An OLED display device comprising an OLED display panel of claim 3.

8. An OLED display panel, comprising:
an array substrate which is covered by a cathode,
a color filter substrate on which an auxiliary electrode is formed,
a contact structure provided between the color filter substrate and the array substrate,
wherein the contact structure is configured to electrically connect the cathode and the auxiliary electrode, and the contacting area between the contact structure and the array substrate is greater than or equal to that between the auxiliary electrode and the contact structure, and the contact structure is in contact with the auxiliary electrode and does not include the cathode,
wherein the contact structure comprises a spacer formed on a planarization layer of the color filter substrate, and the auxiliary electrode is on top of the spacer;
a pixel defining layer of the array substrate has a depressed section at a location corresponding to the spacer;
the cathode further covers the surface inside the depressed section;
the spacer on the color filter substrate with the auxiliary electrode formed on its top is inserted into the depressed section of the array substrate whose surface is covered with the cathode.

9. The OLED display panel of claim 8, wherein a surface shape of the depressed section of the array substrate after being covered by the cathode on the surface matches a surface shape of the spacer contained in the depressed section which is formed on the color filter substrate with the auxiliary electrode on its top.

10. The OLED display panel of claim 8, wherein conducting glue is placed between the spacer, which has the auxiliary electrode on its top, contained in the depressed section and the cathode in the depressed section.

11. The OLED display panel of claim 9, wherein conducting glue is placed between the spacer, which has the auxiliary electrode on its top, contained in the depressed section and the cathode in the depressed section.

12. An OLED display device comprising an OLED display panel of claim 8.

13. An OLED display device comprising an OLED display panel of claim 9.

* * * * *